United States Patent
Oohori et al.

(10) Patent No.: US 11,156,989 B2
(45) Date of Patent: Oct. 26, 2021

(54) MATERIAL MANAGEMENT APPARATUS AND MATERIAL PREPARING METHOD

(71) Applicant: Panasonic Intellectual Property Management Co., Ltd., Osaka (JP)

(72) Inventors: Tetsushi Oohori, Tokyo (JP); Toshihide Otsuka, Tokyo (JP); Ryo Senoo, Fukuoka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 742 days.

(21) Appl. No.: 15/952,309

(22) Filed: Apr. 13, 2018

(65) Prior Publication Data

US 2018/0329400 A1 Nov. 15, 2018

(30) Foreign Application Priority Data

May 10, 2017 (JP) .............................. JP2017-093509
May 10, 2017 (JP) .............................. JP2017-093510

(51) Int. Cl.
*G05B 19/418* (2006.01)
*H05K 13/02* (2006.01)
*H05K 13/08* (2006.01)

(52) U.S. Cl.
CPC ....... *G05B 19/41865* (2013.01); *H05K 13/02* (2013.01); *H05K 13/021* (2013.01);
(Continued)

(58) Field of Classification Search
CPC .... G05B 19/41865; G05B 2219/31376; G05B 2219/32252; G05B 2219/45029;
(Continued)

(56) References Cited

U.S. PATENT DOCUMENTS 5,778,638 A 7/1998 Watanabe et al.
6,331,076 B1 12/2001 Coll
(Continued)

FOREIGN PATENT DOCUMENTS

CN 101052927 A 10/2007
CN 103792965 A * 5/2014
(Continued)

OTHER PUBLICATIONS

English Translation of Chinese Search Report dated Jul. 23, 2020 for the related Chinese Patent Application No. 201810375661.0.

*Primary Examiner* — Gary Collins
(74) *Attorney, Agent, or Firm* — Pearne & Gordon LLP

(57) ABSTRACT

A material management apparatus (management computer) includes a production plan acquirer that acquires production plan information including a type of a material (cream solder) for bonding a component to a substrate, the material being used for production of a mounting substrate obtained by mounting the component on the substrate; a material status acquirer that acquires material status information on the material preserved in a material preservatory which preserves an accommodating portion (solder pot) in which the material is accommodated; and a material preparation instructor that creates and transmits an instruction to prepare the accommodating portion to be put out from the material preservatory, based on the production plan information and the material status information.

11 Claims, 11 Drawing Sheets

(52) U.S. Cl.
CPC ... *H05K 13/08* (2013.01); *G05B 2219/31376* (2013.01); *G05B 2219/32252* (2013.01); *G05B 2219/45029* (2013.01); *G05B 2219/45031* (2013.01); *Y02P 90/02* (2015.11)

(58) Field of Classification Search
CPC ......... G05B 2219/45031; H05K 13/02; H05K 13/021; H05K 13/08; Y02P 90/02
See application file for complete search history.

(56) References Cited

U.S. PATENT DOCUMENTS

| | | | | |
|---|---|---|---|---|
| 2002/0143423 | A1* | 10/2002 | Huber | G05B 19/41865 700/121 |
| 2006/0200264 | A1 | 9/2006 | Kodama et al. | |
| 2007/0046283 | A1* | 3/2007 | Onishi | H05K 3/3485 700/110 |
| 2007/0270992 | A1 | 11/2007 | Nishida et al. | |
| 2013/0002436 | A1* | 1/2013 | Chang | B23K 3/08 340/588 |
| 2013/0004266 | A1* | 1/2013 | Chang | B23K 3/08 414/148 |

FOREIGN PATENT DOCUMENTS

| | | |
|---|---|---|
| JP | H05-004703 A | 1/1993 |
| JP | H09-295678 A | 11/1997 |
| JP | 2002-528740 A | 9/2002 |
| JP | 2003-303006 A | 10/2003 |
| JP | 2004-131249 A | 4/2004 |
| JP | 2004-134691 A | 4/2004 |
| JP | 2005-271030 A | 10/2005 |
| JP | 2006-237566 A | 9/2006 |
| JP | 2008-217114 A | 9/2008 |
| WO | 2005/009101 A1 | 1/2005 |

\* cited by examiner

FIG. 7

| MATERIAL STATUS INFORMATION | Isa(Isb) | | | | |
|---|---|---|---|---|---|
| POT NUMBER | MATERIAL TYPE | SOLDER WEIGHT | PRESERVATION STATE | ELAPSED STANDING TIME AT NORMAL TEMPERATURE | MATERIAL PRESERVATION TIME |
| A001 | AAAA | 200g | DURING STRRING | | 48 HOURS |
| B001 | BBBB | 150g | NORMAL PRESERVATION | ONE HOUR | 60 HOURS |
| A002 | AAAA | 200g | LOW TEMPERATURE PRESERVATION | | 48 HOURS |
| A003 | AAAA | 75g | LOW TEMPERATURE PRESERVATION | | 20 HOURS |
| ... | ... | ... | ... | ... | ... |
| ↑ 81 | ↑ 82 | ↑ 83 | ↑ 84 | ↑ 85 | ↑ 86 |

FIG. 8

PREPARATION INSTRUCTION INFORMATION (1) — Pea1(Peb1, Pec1)

| POT NUMBER | OPERATION CONTENT |
|---|---|
| A001 | TRANSPORT TO ENTRANCE |
| B001 | TRANSPORT TO STIRRER |
| B001 | STIRRING EXECUTION |
| B001 | TRANSPORT TO ENTRANCE |
| A002 | TRANSPORT TO NORMAL TEMPERATURE PRESERVATION |
| ... | ... |

PREPARATION INSTRUCTION INFORMATION (2) — Pea2(Peb2, Pec2)

| POT NUMBER | PREPARATION FINISH TIME |
|---|---|
| A001 | 2017/02/20 10:15 |
| B001 | 2017/02/20 11:00 |
| A002 | 2017/02/20 19:30 |
| A003 | 2017/02/22 08:00 |
| ... | ... |

↑ 101    ↑ 102

| OPERATION PROCEDURE INFORMATION | | | — Pr |
|---|---|---|
| POT NUMBER | OPERATION START TIME | OPERATION CONTENT |
| A001 | 2017/02/20 10:20 | TRANSPORT TO ENTRANCE |
| B001 | 2017/02/20 10:40 | TRANSPORT TO STIRRER |
| B001 | 2017/02/20 10:50 | STIRRING EXECUTION |
| B001 | 2017/02/20 11:05 | TRANSPORT TO ENTRANCE |
| A002 | 2017/02/20 18:00 | TRANSPORT TO NORMAL TEMPERATURE PRESERVATION |
| A002 | 2017/02/20 19:05 | TRANSPORT TO STIRRER |
| A002 | 2017/02/20 19:15 | STIRRING EXECUTION |
| ... | ... | ... |
| ↑ 111 | ↑ 112 | ↑ 113 |

MATERIAL MANAGEMENT APPARATUS AND MATERIAL PREPARING METHOD

BACKGROUND

1. Technical Field

The present disclosure relates to a material management apparatus and a material preparing method for managing putting in and out of a material preservatory of an accommodating portion in which a material for bonding a component to a substrate is accommodated.

2. Description of the Related Art

In production of a mounting substrate on which a component is mounted on a substrate, a material for bonding a component to a substrate, such as a cream solder or an adhesive is used. These materials are packed in the accommodating portion such as a container, and are preserved in the material preservatory at low temperature. Components and materials that are consumed in the process of producing the mounting substrate and the remaining amount is reduced are put out from a component preservatory and a material preservatory, and are supplied to a mounting device and a printing device (for example, Japanese Patent Unexamined Publication No. 2004-134691). A component supply management system disclosed in Japanese Patent Unexamined Publication No. 2004-134691 notifies a supply schedule at which components are put out from the component preservatory so as to be supplied to the mounting device while predicting run-out time of the component from the number of remaining components.

SUMMARY

A material management apparatus of the disclosure includes a production plan acquirer that acquires production plan information including a type of a material for bonding a component to a substrate, the material being used for production of a mounting substrate obtained by mounting the component on the substrate; a material status acquirer that acquires material status information on the material preserved in a material preservatory which preserves an accommodating portion in which the material is accommodated; and a material preparation instructor that creates and transmits an instruction to prepare the accommodating portion to be put out from the material preservatory, based on the production plan information and the material status information.

A material preparing method of the disclosure includes a production plan acquiring step of acquiring production plan information including a type of a material for bonding a component to a substrate, the material being used for production of a mounting substrate obtained by mounting the component on the substrate; a material status acquiring step of acquiring material status information on the material preserved in a material preservatory which preserves an accommodating portion in which the material is accommodated; and a material preparation instructing step of creating and transmitting a preparation instruction of the accommodating portion put out from the material preservatory, based on the production plan information and the material status information.

According to the disclosure, it is possible to efficiently manage a material in consideration of a preparing operation of a material for bonding a component to a substrate.

BRIEF DESCRIPTION OF THE DRAWINGS

FIG. 7 is a configuration explanatory view of an example of material status information used in the component mounting system of one embodiment of the disclosure;

FIG. 8 is a configuration explanatory view of an example of first preparation instruction information used in the component mounting system of one embodiment of the disclosure;

FIG. 9 is a configuration explanatory view of an example of second preparation instruction information used in the component mounting system of one embodiment of the disclosure;

DETAILED DESCRIPTIONS

Figure 1:
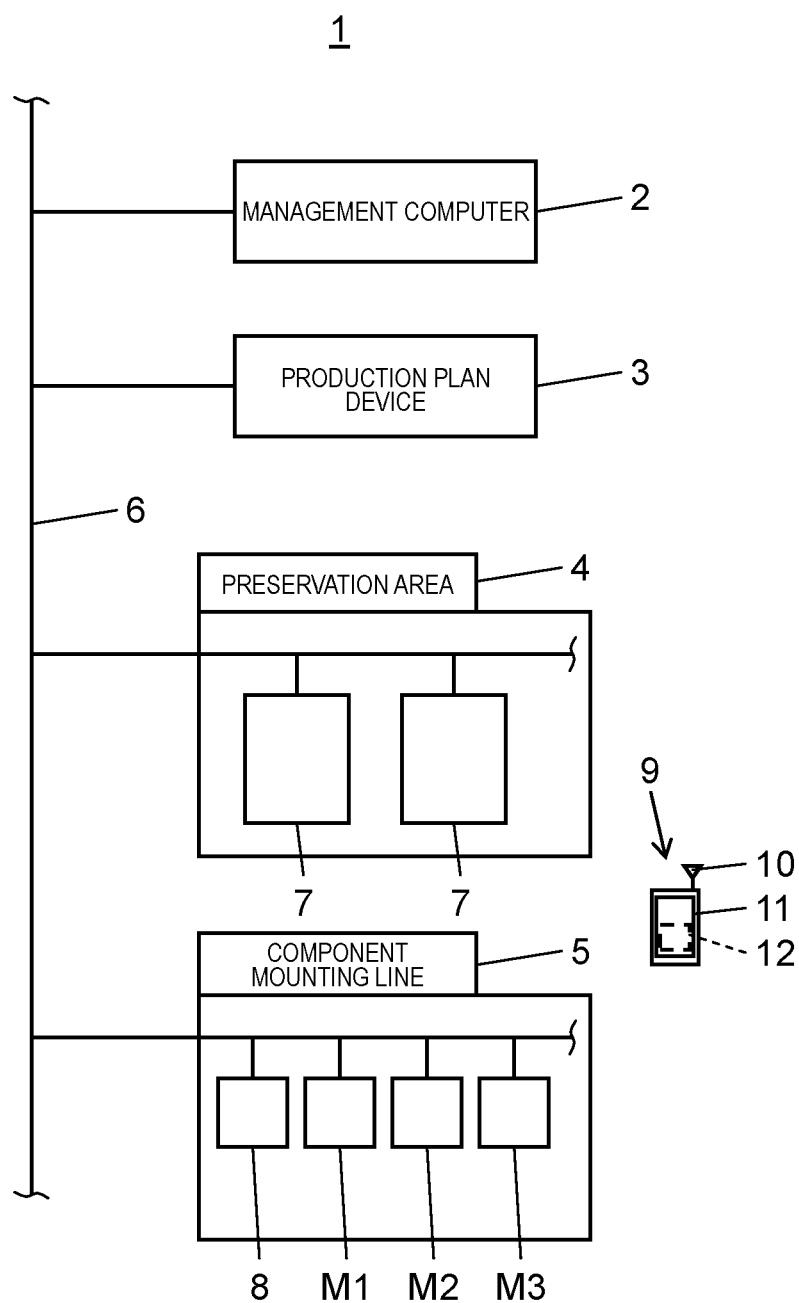
FIG. 1 is a configuration explanatory view of a component mounting system of one embodiment of the disclosure.

Prior to detailed description, problems in the related art will be briefly described.

Depending on a material for bonding a component to a substrate, it is necessary to perform an operation of stirring the material by taking out from the material preservatory and leaving it at normal temperature for a predetermined period of time, before supplying the material to a mounting device and a printing device. However, in the related art including a technique disclosed in Japanese Patent Unexamined Publication No. 2004-134691, there was a problem in that management of the material including these operations is not taken into consideration, and there is still room for further improvement.

In this regard, an object of the disclosure is to provide a material management apparatus and a material preparing method which can efficiently manage a material in consideration of a preparing operation before supplying a material for bonding a component to a substrate.

One embodiment of the disclosure will be described in detail with reference to the drawings. The configurations, shapes, and the like described below are illustrative examples, and can be appropriately changed in accordance with specifications of a component mounting system, a management computer (a material management apparatus), and a material preservatory. In the following description, the same reference numerals are given to the corresponding elements in all drawings, and thus redundant description will be not repeated.

First, a configuration of component mounting system 1 will be described with reference to FIG. 1. Component mounting system 1 has a function of managing and preserving a material for bonding a component to a substrate, and a function of producing a mounting substrate by mounting the component on the substrate. Component mounting system 1 is configured to mainly include management computer 2, production plan device 3, preservation area 4, and component mounting line 5, and each portion is connected to communication network 6. Management computer 2 performs management of the material used in component mounting system 1, and production management of the mounting substrate. Production plan device 3 creates production plan information including a substrate type, the number of produced substrates, timing of production, and the like of the mounting substrate obtained by mounting the component on the substrate produced in component mounting system 1.

A plurality (here, two) of material preservatory 7 are connected to communication network 6 are installed on preservation area 4. Material preservatory 7 preserves an accommodating portion in which a material such as a cream solder or an adhesive for bonding the component on the substrate is accommodated. Component mounting line 5 is provided with line management device 8, printing device M1, and mounting devices M2 and M3, and each device is connected to management computer 2 via communication network 6. Printing device M1 performs a solder printing operation of printing the cream solder (material) on the substrate transported from the upstream side by a printing operator via a mask.

Mounting devices M2 and M3 produce the mounting substrate by performing a component mounting operation of mounting the component on the substrate, on which the cream solder is printed by printing device M1, by a component mounting operator. Mounting devices M2 and M3 are provided with an adhesive coating device, and mount the component after coating the substrate with an adhesive (material) depending on the type of the component to be mounted. Note that, the adhesive coating device may not be built in mounting devices M2 and M3 but may be disposed as a single adhesive coating device on the upstream side of mounting devices M2 and M3. Line management device 8 manages the operation between the devices of component mounting line 5, and collects information on production start time of the mounting substrate, remaining amount of the material such as the cream solder of printing device M1, and the adhesive of mounting devices M2 and M3, and the number of remaining components supplied by the component supply device of mounting devices M2 and M3.

Note that, the number of mounting devices M2 and M3 provided in component mounting line 5 is not necessarily two, but may be one or three or more. The number of component mounting line 5 provided in the component mounting system 1 is not necessarily one, but a plurality of component mounting lines 5 may be provided in component mounting system 1. In a case where component mounting system 1 is provided with the plurality of component mounting lines 5, line management device 8 may be disposed for each component mounting line 5, or one common line management device 8 may be disposed the plurality of component mounting lines 5. That is, the information collected by line management device 8 may be stored in association with the information specifying each device of each component mounting line 5.

Figure 2:
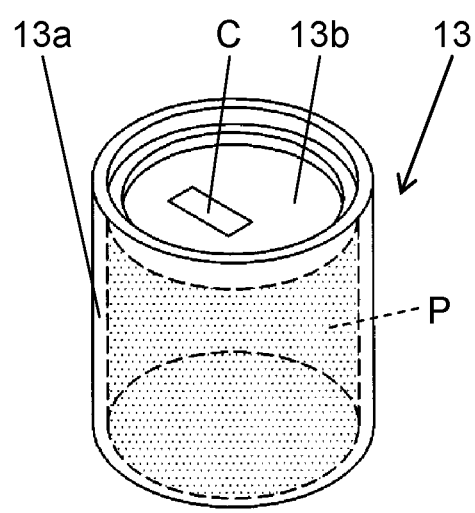
FIG. 2 is a configuration explanatory view of a solder pot for accommodating a cream solder used in the component mounting system of one embodiment of the disclosure.

Here, as an example of the accommodating portion, in which the material for bonding the component to the substrate (the cream solder and the adhesive) is accommodated, preserved in material preservatory 7, solder pot 13 accommodating cream solder P will be described with reference to FIG. 2. Solder pot 13 has a configuration in which cream solder P is accommodated in tubular bottomed main body 13a and the upper portion of main body 13a is closed with lid 13b. Identification code C such as a bar code or a two-dimensional code is affixed to the upper surface of lid 13b. Information and the like for specifying solder pot 13 and cream solder P accommodated therein are recorded in identification code C. Note that, identification code C may be affixed to the side surface or the bottom surface of main body 13a.

In FIG. 1, an operator who performs various types of operations by preservation area 4, component mounting line 5, and the like carries mobile terminal 9. Mobile terminal 9 is provided with terminal side communicator 10 that wirelessly communicates with management computer 2 so as to transmit and receive information, touch panel 11 having a display function and an input function, and code reader 12. Mobile terminal 9 displays various types of information received from management computer 2 on touch panel 11 through display processing. Code reader 12 recognizes the various types of information recorded in identification code C by scanning identification code C (refer to FIG. 2) affixed to solder pot 13. Mobile terminal 9 transmits the various types of information input from touch panel 11, information on solder pot 13 recognized by code reader 12, and the like to management computer 2.

Next, a configuration of material preservatory 7 will be described with reference to FIG. 3. Material preservatory 7 preserves a plurality of accommodating portions (solder pot 13) in which a material (cream solder P, adhesive, or the like) for bonding the component on the substrate is accommodated. Hereinafter, an example of material preservatory 7 preserving solder pot 13 will be described. Entrance 14 and touch panel 15 are disposed on the front surface of material preservatory 7. Solder pot 13 (accommodating portion) is received in and released from material preservatory 7 through entrance 14. Touch panel 15 has a display function and an input function, on which the information of solder pot 13 preserved in material preservatory 7 is displayed, and an instruction or the like to material preservatory 7 is input by an operator.

Low temperature preservation 16, normal temperature preservation 17, stirrer 18, transporting means 19, and weigher 20 are provided in material preservatory 7. Low temperature preservation 16 is provided with a plurality (here, nine) of low temperature preservation shelves 16a that preserve solder pot 13 (accommodating portion) at low temperature. Normal temperature preservation 17 is provided with a plurality (here, six) of normal temperature preservation shelves 17a that preserve solder pot 13 (accommodating portion) at temperature such as room temperature (normal temperature) higher than low temperature preservation 16. The temperature of low temperature preservation 16 and the temperature of normal temperature preservation 17 are appropriately set in accordance with the specification of cream solder P (material) accommodated in solder pot 13 to be preserved.

Figure 3:
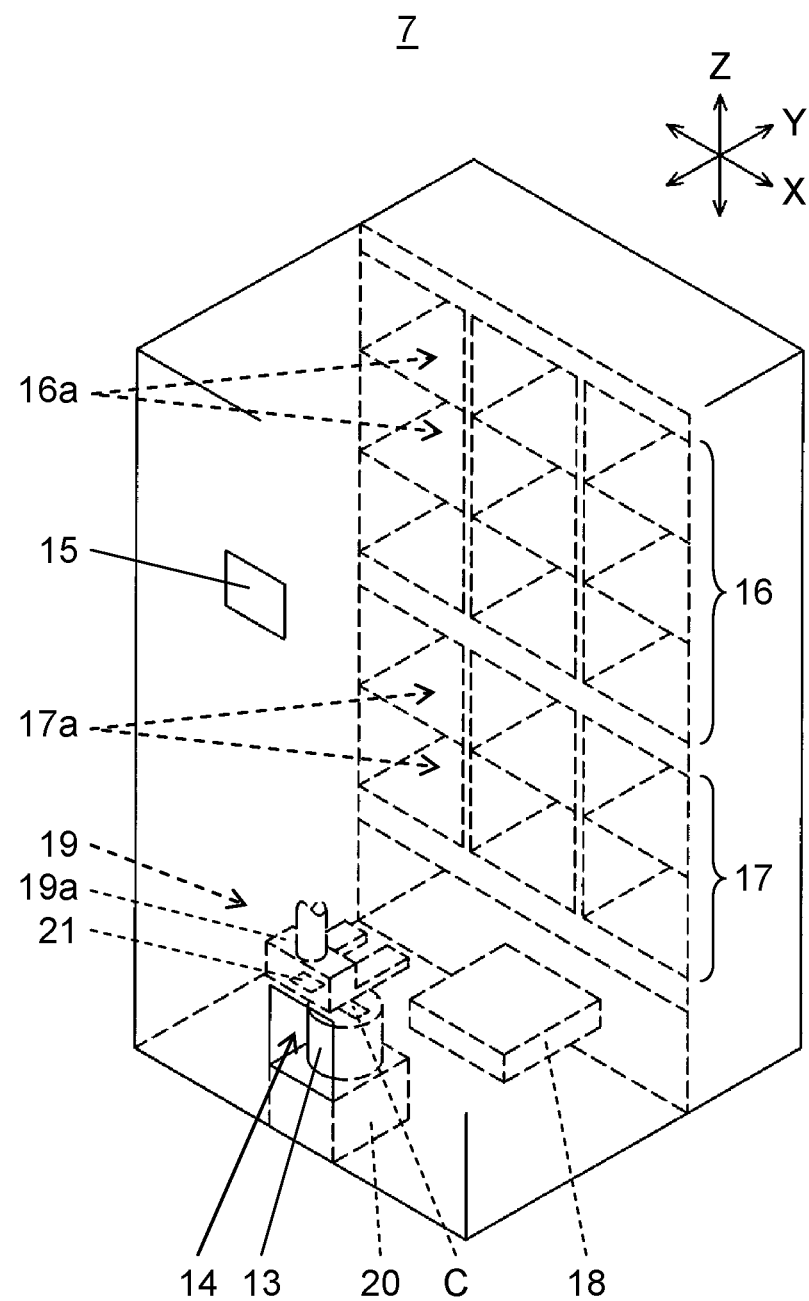
FIG. 3 is a configuration explanatory view of the material preservatory of one embodiment of the disclosure.

In FIG. 3, stirrer 18 stirs cream solder P (material) accommodated in solder pot 13 (accommodating portion). For example, stirrer 18 holds and turns solder pot 13 to generate a centrifugal force and stirs cream solder P in solder pot 13. Stirring time Tm for stirring cream solder P (material) in stirrer 18 and stirring strength are appropriately set in accordance with the specification of cream solder P (material) accommodated in solder pot 13.

Transporting means 19 is provided with transport head 19a and a transport head moving mechanism (not shown) holding solder pot 13. The transport head moving mechanism causes transport head 19a to move in the X direction and the Y direction orthogonal to each other in the horizontal plane and in the Z direction orthogonal to the horizontal plane.

When the transport head moving mechanism causes transport head 19a to move, transporting means 19 transports solder pot 13 (accommodating portion) between entrance 14, low temperature preservation shelf 16a (low temperature preservation 16), normal temperature preservation shelf 17a (normal temperature preservation 17), and stirrer 18.

In FIG. 3, weigher 20 for weighing the weight of solder pot 13 (accommodating portion) is disposed on the upper surface of the table on which solder pot 13 received in material preservatory 7 is placed through entrance 14. Weigher 20 measures the weight of solder pot 13 when solder pot 13 is received through entrance 14.

Code reader 21 for recognizing various types of information recorded in identification code C is provided at a position facing identification code C affixed to solder pot 13 of transport head 19a. Code reader 21 recognizes the various types of information recorded in identification code C when solder pot 13 is received and released. That is, code reader 21 is recognizing means that recognizes identification code C (identification information of accommodating portion) indicated in (affixed to) solder pot 13 (accommodating portion). Note that, the position where code reader 21 is disposed can be freely changed corresponding to the position of identification code C displayed on solder pot 13.

Figure 4:
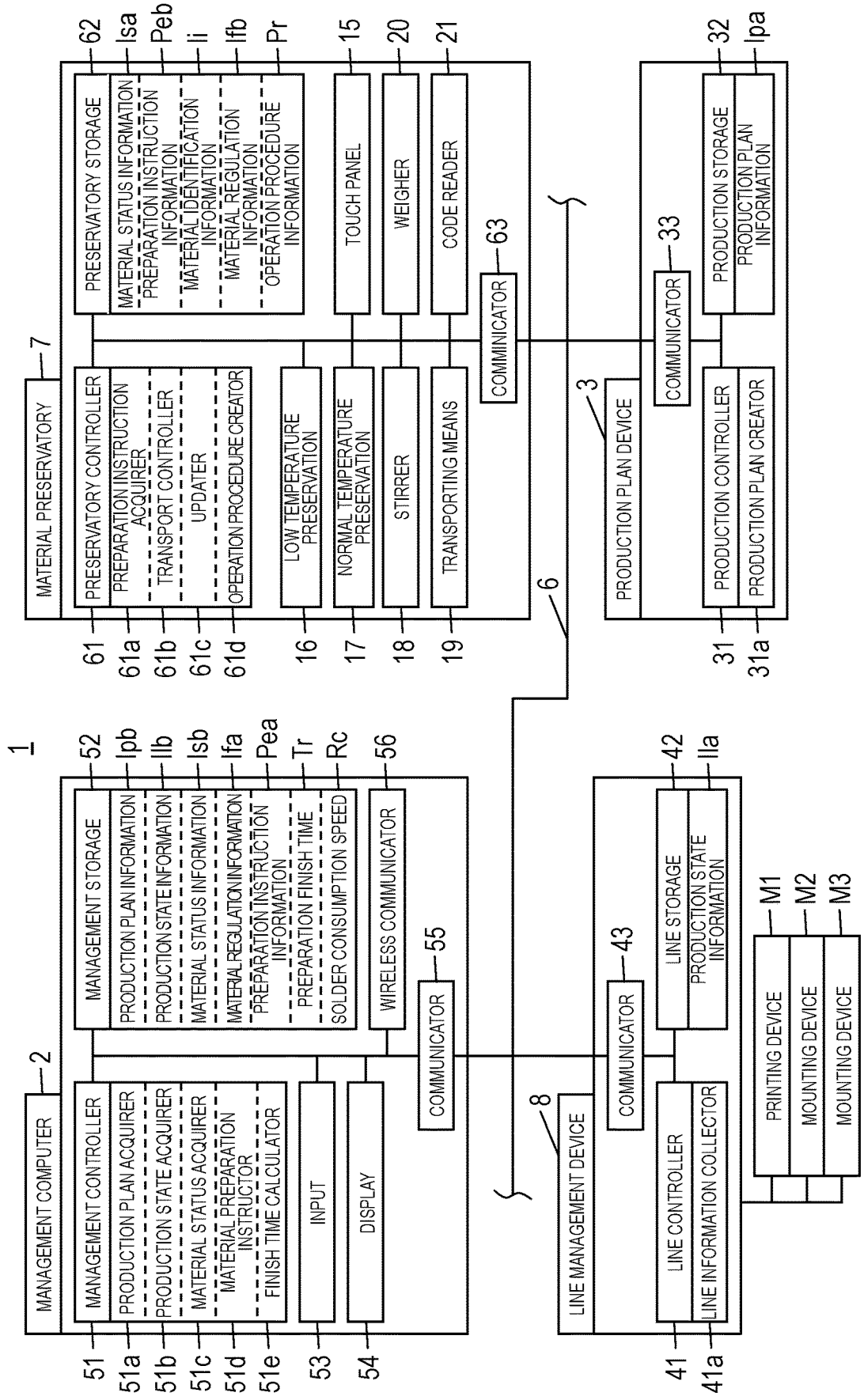
FIG. 4 is a block diagram illustrating a configuration of a control system of the component mounting system of one embodiment of the disclosure.

Next, a configuration of a control system of component mounting system 1 with reference to FIG. 4. Production plan device 3 is provided with production controller 31, production storage 32, and communicator 33. Communicator 33 is a communication interface, and exchanges signals and information with management computer 2 via communication network 6. Production controller 31 is a computing device which has a CPU function, and includes an internal processor such as production plan creator 31a. Production storage 32 is a storage device and stores production plan information Ipa and the like.

Production plan creator 31a generates production plan information Ipa including a substrate type and the number of produced substrates of the mounting substrate produced in component mounting line 5, and types of materials (cream solder P, adhesive, and the like) used in the production of the mounting substrate based on various types of information stored in production storage 32, and various types of information acquired from database (not shown) connected to communication network 6, and stores the generated information in production storage 32. Note that, the material type used in the production of the mounting substrate may be set in advance by the operator, or may be set based on the result used in the production of the target mounting substrate. The material type having the same or similar characteristics, such as a thixotropic ratio, as those of the material type used in the production in the past may be set as the material type used in the production of the mounting substrate. A term "production plan information Ipa" is not limited as long as material information used in the mounting substrate to be produced.

In FIG. 4, line management device 8 is provided with line controller 41, line storage 42, and communicator 43. Communicator 43 is a communication interface, and exchanges signals and information with management computer 2 via communication network 6. Line controller 41 is a computing device which has a CPU function, and includes an internal processor such as line information collector 41a. Line storage 42 is a storage device and stores production state information Ila and the like. Line information collector 41a collects information on production start time of mounting substrate in component mounting line 5, the remaining amount (cream solder P and adhesive) of the material used in the production equipment (printing device M1, and mounting devices M2 and M3) for producing mounting substrate, or the number of produced (printed or mounted) mounting substrates, and stores the collected information to line storage 42 as production state information Ila. Production state information Ila is successively updated by line information collector 41a.

In FIG. 4, management computer 2 is provided with management controller 51, management storage 52, input 53, display 54, communicator 55, and wireless communicator 56. Input 53 is an input device such as a keyboard, a touch panel, and a mouse, and is used at the time of operation commands and data input. Display 54 is a display device such as a liquid crystal panel, and displays various types of information in addition to various types of screens such as an operation screen for operation by input 53. Communicator 55 is a communication interface, and exchanges signals and information between production plan device 3, material preservatory 7, and line management device 8 via communication network 6. Wireless communicator 56 wirelessly communicates with mobile terminal 9 to exchange information.

Management controller 51 is a computing device having a CPU function, and includes an internal processor such as production plan acquirer 51a, production state acquirer 51b, material status acquirer 51c, material preparation instructor 51d, and finish time calculator 51e. Management storage 52 is a storage device, and stores production plan information Ipb, production state information Ilb, material status information Isb, material regulation information Ifa, preparation instruction information Pea, preparation finish time Tr, and solder consumption speed Rc.

In FIG. 4, production plan acquirer 51a acquires production plan information Ipa from production plan device 3, and stores the acquired information in management storage 52 as production plan information Ipb. Production state acquirer 51b acquires production state information Ila from line management device 8, and stores the acquired information in management storage 52 as production state information Ilb. Material status acquirer 51c acquires material status information Isa of the preserved material (cream solder P and adhesive) from material preservatory 7, and stores the acquired information in management storage 52 as material status information Isb.

Figure 6:
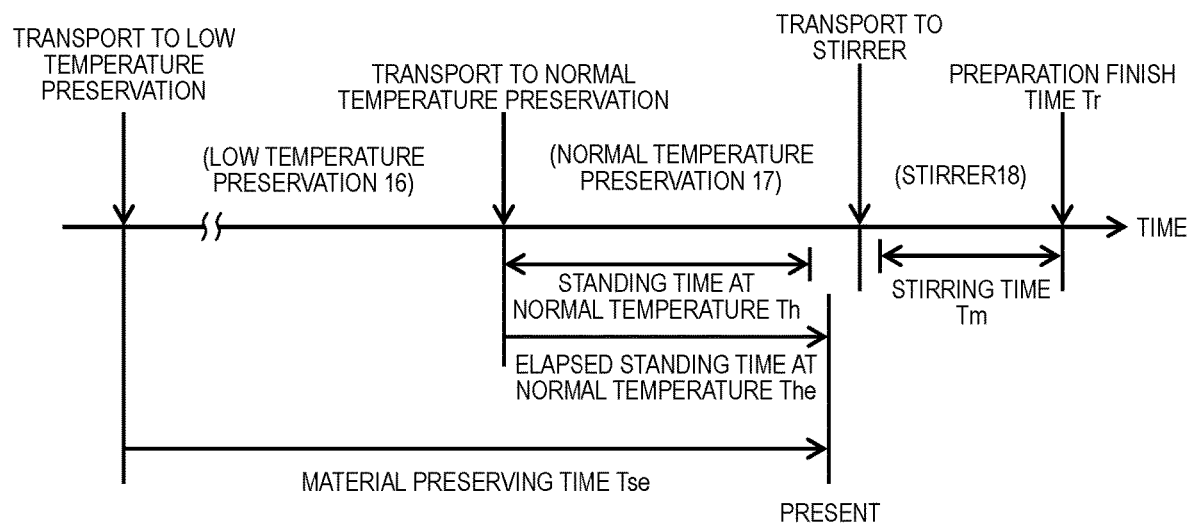
FIG. 6 is an explanatory view of timing of the preparing operation in the material preservatory of one embodiment of the disclosure.

Here, an example of material status information Isb (Isa) of material preservatory 7 which preserves solder pot 13 will be described with reference to FIG. 7. In this example, as material status information Isb, a pot number specifying solder pot 13 is included in section 81 "pot number", the material type of cream solder P accommodated in solder pot 13 is included in section 82 "material type", the weight of cream solder P accommodated in solder pot 13 is included in section 83 "solder weight", the preservation state of solder pot 13 is included in section 84 "preservation state", elapsed standing time at normal temperature The (refer to FIG. 6) which is an elapsed from when solder pot 13 is transported to normal temperature preservation 17 until the present time is included in section 85 "elapsed standing time at normal temperature", and material preserving time Tse (refer to FIG. 6) which is an elapsed time from when solder pot 13 is received in material preservatory 7 (transported to low temperature preservation 16) until the present time is included in section 86 "material preserving time".

The preservation state in section 84 "preservation state" is a preservation state of solder pot 13 (accommodating portion) in material preservatory 7, "low temperature preservation" in which solder pot 13 is at low temperature preservation 16, "normal temperature preservation" in which solder pot 13 is normal temperature preservation 17, "before stirring" in which solder pot 13 is in stirrer 18 before stirring, "in stirring" in which solder pot 13 is during stirring, "after stirring" in which solder pot 13 is after stirring, and "entrance" in which in which solder pot 13 is in entrance 14 are stored.

In FIG. 4, in material regulation information Ifa, the low temperature preservation temperature at the time of the low temperature preservation, the normal temperature preservation temperature at the time of the normal temperature preservation, standing time at normal temperature Th (refer to FIG. 6) which is a recommended time for which cream solder P is left to stand from when moving the low temperature preservation to the normal temperature preservation until stirring, and stirring time Tm (refer to FIG. 6) which is a recommended time for which cream solder P is stirred by stirrer 18 are stored for each type of material of cream solder P.

Material preparation instructor 51d creates a preparation instruction of solder pot 13 (accommodating portion) put out of material preservatory 7 based on production plan information Ipb and material status information Isb, and then stores the preparation instruction in management storage 52 as preparation instruction information Pea. Material preparation instructor 51d transmits the created preparation instruction information (preparation instruction) to material preservatory 7 and mobile terminal 9. More specifically, in a case where the preservation state of solder pot 13 (accommodating portion) to be put out is in the low temperature preservation, material preparation instructor 51d instructs solder pot 13 to move from the low temperature preservation to the normal temperature preservation (move from low temperature preservation 16 to normal temperature preservation 17).

In a case where elapsed standing time at normal temperature The of solder pot 13 (accommodating portion) to be put out has elapsed standing time at a predetermined normal temperature Th, material preparation instructor 51d instructs solder pot 13 to be stirred (moved from normal temperature preservation 17 to stirrer 18, and then stirred by stirrer 18 for stirring time Tm). Material preparation instructor 51d instructs for putting out solder pot 13 with priority, which has longer material preserving time Tse among the plurality of solder pots 13 (accommodating portions) preserved in material preservatory 7.

Note that, a receiving time of solder pot 13 is stored of in material status information Isa (Isb), and material preparation instructor 51d may instruct for putting out solder pot 13 having an old receiving time with the priority. Material preparation instructor 51d instructs for putting out solder pot 13 with priority, which has light solder weight among the plurality of solder pots 13 preserved in material preservatory 7. Material preparation instructor 51d instructs for putting out solder pot 13 in which a part of the material is used in preference to unused solder pot 13. The history of receipt and release of solder pot 13 stored in material status information Isa (Isb) determines that solder pot 13 is used or unused.

Here, an example of first embodiment (hereinafter, referred to as "first preparation instruction information Pea1") of preparation instruction information Pea will be described with reference to FIG. 8. In this example, as first preparation instruction information Pea1, the pot number is included in section 91 "pot number", and the operation content in material preservatory 7 is included in section 92 "operation content". Here, among solder pots 13 (refer to FIG. 7) preserved in material preservatory 7, solder pots 13 having pot numbers of A001, B001, and A002 are put out (released). Note that, material preparation instructor 51d selects, as a target to be put out, solder pot 13 (A002) having material preserving time Tse for 48 hours which is longer than 20 hours of material preserving time Tse of solder pot 13 (A003), among solder pot 13 (A002) and solder pot 13 (A003) which have the same material types preserved in the low temperature preservation.

Material preparation instructor 51d causes the preparation instruction to be transmitted when operation target solder pot 13 is in an operatable state based on the preservation state included in acquired material status information Isb. More specifically, first, in material preparation instructor 51d, material preparation instructor 51d transmits the preparation instruction of an operation content in which solder pot 13 (A001) is transported to "entrance" when a stirring operation of solder pot 13 (A001) (refer to FIG. 7) of which the preservation state is "in stirring" state is finished (when the preservation state is "after stirring" state) (refer to FIG. 8). Next, material preparation instructor 51d transmits the preparation instruction of the operation content in which solder pot 13 (B001) (refer to FIG. 7) in which the preservation state is kept in the normal temperature preservation and the elapsed standing time at normal temperature The has passed one hour and standing time at normal temperature Th (for example, one hour) is transported to "stirrer" (refer to FIG. 8).

Subsequently, when solder pot 13 (B001) is transmitted to stirrer 18 (when the preservation state is "before stirring" state), the preparation instruction of the operation content for "stirring execution" is transported (refer to FIG. 8). Next, material preparation instructor 51d transmits the preparation instruction of an operation content in which solder pot 13 (B001) is transported to "entrance" when a stirring operation of solder pot 13 (B001) of which the preservation state is "in stirring" state is finished (when the preservation state is "after stirring" state) (refer to FIG. 8). Then, the preparation instruction of the operation content in which solder pot 13 (A002) of which the preservation state is kept in the low temperature preservation (refer to FIG. 7) is "transported to normal temperature preservation" is transmitted (refer to FIG. 8).

In FIG. 4, finish time calculator 51e calculates preparation finish time Tr during which preparation of putting out solder pot 13 (accommodating portion) from material preservatory 7 is finished (refer to FIG. 6) based on production start time, the remaining amount of the material, or the number of produced (printed) sheets included in production state information IIb. More specifically, finish time calculator 51e calculates preparation finish time Tr during which preparation of cream solder P (or adhesive) for supply is finished based on the remaining amount of cream solder P used in printing device M1 of component mounting line 5 (or the remaining amount of adhesive used in mounting devices M2 and M3), and solder consumption speed Rc (or adhesive consumption speed) stored in management storage 52. Alternatively, finish time calculator 51e calculates preparation finish time Tr during which preparation of cream solder P (or adhesive) for supply is finished based on the number of produced (printed) sheets and solder consumption speed Rc (or adhesive consumption speed).

Solder consumption speed Rc is the amount of consumption of cream solder P per unit time or per one mounting substrate, and is calculated based on a production result in the past, an opening area of a mask, and the thickness of the mask. That is, finish time calculator 51e is a preparation finish time calculator that calculates preparation finish time Tr during which a preparation of putting out accommodating portion (solder pot 13) from material preservatory 7 is finished based on the number of produced sheets of the mounting substrate to be produced and the consumption amount of the material (solder consumption rate Rc) consumed per one sheet of the mounting substrate to be produced.

Alternatively, in a case where the consumption time during which the consumption of the material is exhausted after solder pot 13 is set in printing device M1 according to the production result in the past, or cream solder P accommodated in solder pot 13 is supplied to printing device M1 is recognized, finish time calculator 51e calculates preparation finish time Tr based on the calculates the production start time and the consumption time. Calculated preparation finish time Tr is stored in management storage 52. In a case where preparation finish time Tr is calculated, material preparation instructor 51d may instruct for finishing the preparation of solder pot 13 (accommodating portion) to be put out before preparation finish time Tr.

Here, an example of second embodiment (hereinafter, referred to as "second preparation instruction information Pea2") of preparation instruction information Pea will be described with reference to FIG. 9. In this example, as second preparation instruction information Pea2, the pot number is included in section 101 "pot number", and preparation finish time Tr is included in section 102 "preparation finish time". For example, the preparation instruction in which the pot number is solder pot 13 (A001) of "A001" is created such that the preparation of putting out is finished by "2017/02/20 10:15" which is preparation finish time Tr.

As described above, management computer 2 of the embodiment is a material management apparatus which is provided with production plan acquirer 51a that acquires production plan information Ipa (Ipb), material status acquirer 51c that acquires material status information Isa (Isb), management storage 52 that stores production plan information Ipb and material status information Isb, and material preparation instructor 51d that creates and transmits a preparation instruction of solder pot 13 (accommodating portion) put out of material preservatory 7 based on production plan information Ipb and material status information Isb. With this, it is possible to efficiently manage the material in consideration of preparing operation of the material for bonding the component to the substrate (cream solder P and adhesive).

In FIG. 4, material preservatory 7 is provided with preservatory controller 61, preservatory storage 62, touch panel 15, low temperature preservation 16, normal temperature preservation 17, stirrer 18, transporting means 19, weigher 20, code reader 21, and communicator 63. Communicator 63 is a communication interface, and exchanges signals and information with management computer 2 via communication network 6. Preservatory controller 61 is a computing device which has a CPU function, and includes an internal processor such as preparation instruction acquirer 61a, transport controller 61b, updater 61c, and operation procedure creator 61d.

Preservatory storage 62 is a storage device, and stores material status information Isa, preparation instruction information Peb, material identification information Ii, material regulation information Ifb, and operation procedure information Pr. A state of material (cream solder P and adhesive) preserved in material preservatory 7, such as material preserving time Tse which is elapsed time from receiving the accommodating portion (solder pot 13) is stored in material status information Isa (refer to FIG. 7).

In material regulation information Ifb, the low temperature preservation temperature at the time of the low temperature preservation, the normal temperature preservation temperature at the time of the normal temperature preservation, standing time at normal temperature Th (refer to FIG. 6) which is a recommended time for which cream solder P is left to stand from when moving the low temperature preservation to the normal temperature preservation until stirring, and stirring time Tm (refer to FIG. 6) which is a recommended time for which cream solder P is stirred by stirrer 18 are stored for each type of material of cream solder P. That is, standing time at normal temperature Th for which the accommodating portion (solder pot 13) is left to stand in normal temperature preservation 17, and a stirring time at which the material is stirred in the stirrer are stored in preservatory storage 62.

In FIG. 4, preparation instruction acquirer 61a acquires preparation instruction information Pea (first preparation instruction information Pea1 or second preparation instruction information Pea2) from management computer 2, and stores the acquired preparation instruction information in preservatory storage 62 as preparation instruction information Peb (first preparation instruction information Peb1 or second preparation instruction information Peb2) (refer to FIG. 8 or FIG. 9). That is, preparation instruction acquirer 61a acquires the preparation instruction including the material type and the content of the preparing operation of the material to be prepared. The preparation instruction of second preparation instruction information Peb2 includes preparation finish time Tr at which the preparation for releasing preserved solder pot 13 (accommodating portion) is finished.

Transport controller 61b is a controller that controls transporting means 19 based on the preparation instruction included in preparation instruction information Peb and material status information Isa. More specifically, transport controller 61b (controller) transports solder pot 13 (accommodating portion) to any one of entrance 14, low temperature preservation 16, normal temperature preservation 17, and stirrer 18 in accordance with the preparation instruction (operation content) included in the first preparation instruction information Peb1. When solder pot 13 is transported to stirrer 18, transport controller 61b controls transporting means 19 such that solder pot 13 (accommodating portion) is left to stand at least for standing time at normal temperature Th normal temperature preservation 17.

Transport controller 61b (controller) controls transporting means 19 such that among the plurality of solder pots 13

(accommodating portions) preserved in low temperature preservation 16 or normal temperature preservation 17, solder pot 13 having long material preserving time Tse is transported with priority. With this, it is possible to preferentially release cream solder P having long material preserving time Tse and a short time of the period of use. Note that, the period of use is stored in material status information Isa, and then transport controller 61b may control transporting means 19 to preferentially transport solder pot 13 (cream solder P) having the short time of the period of use.

In FIG. 4, stirrer 18 stirs cream solder P (material) accommodated in transported solder pot 13 (accommodating portion) for stirring time Tm. Updater 61c updates preservation state (refer to FIG. 7) of material status information Isa when solder pot 13 (accommodating portion) is transported. Updater 61c updates of the preservation state (refer to FIG. 7) of material status information Isa when stirrer 18 stirs cream solder P (material).

Weigher 20 measures the weight of solder pot 13 (accommodating portion), and updater 61c updates the solder weight (refer to FIG. 7) of material status information Isa based on the measured weight of solder pot 13. In this example, the weight of cream solder P (material) accommodated in solder pot 13, which is obtained by subtracting the weight of vacant solder pot 13 from the measured weight of solder pot 13 is recorded as the solder weight of material status information Isa. In a case where solder pot 13 released from material preservatory 7 is received again, updater 61c calculates a difference between the solder weight before update (at the time of release) and the solder weight after update (at the time of receipt) as the used solder weight, and stores the calculated solder weight in the material status information Isa. The used solder weight is used in the prediction of solder consumption speed Rc for the next production.

In FIG. 4, code reader 21 is a recognizing means for recognizing identification code C (identification information) of solder pot 13 affixed to solder pot 13 (accommodating portion), and updater 61c updates the pot number and the material type of material status information Isa (refer to FIG. 7) based the identification information of recognized solder pot 13. Operation procedure creator 61d creates operation procedure information Pr including the operation content and the operation start time of solder pot 13 (accommodating portion) based on preparation finish time Tr included in the operation instruction of the second preparation instruction information Peb2, standing time at normal temperature Th included in material regulation information Ifb, and stirring time Tm, and stores the created operation procedure information in management storage 52.

Figures 10, 11:
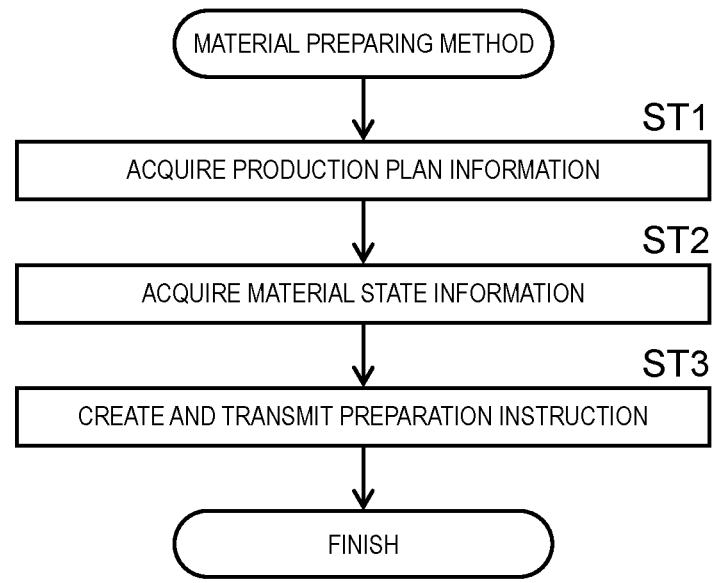
FIG. 10 is a configuration explanatory view of an example of operation procedure information used in the component mounting system of one embodiment of the disclosure.
FIG. 11 is a flow chart of a material preparing method in a management computer of one embodiment of the disclosure.

Here, an example of operation procedure information Pr will be described with reference to FIG. 10. In this example, as operation procedure information Pr, the pot number is included in section 111 "pot number", the operation start time at which each operation is started is included in section 112 "operation start time", and the operation content is included in section 113 "operation content". Operation procedure creator 61d creates the operation start time of each operation such that solder pot 13 to be released can be released (in the state of being transported to entrance 14) at preparation finish time Tr.

For example, regarding solder pot 13 (A002) having the pot number of A002, in order to finish the preparation by "2017/02/20 19:30" which is preparation finish time Tr (refer to FIG. 9) (stirring operation is finished), the operation procedure is instructed such that "transport to the normal temperature preservation" is started at "2017/02/20 18:00", the solder pot is left to stand for standing time at normal temperature Th (here, for one hour) in normal temperature preservation 17, then "transport to the stirrer" is started at "2017/02/20 19:05", and then "stirring execution" is started at "2017/02/20 19:15".

In accordance with this operation procedure, when transport controller 61b controls transporting means 19, and stirrer 18 performs stirring for stirring time Tm (here, 15 minutes), the preparation is finished at preparation finish time Tr. That is, based on operation procedure information Pr, transport controller 61b (controller) controls transporting means 19 such that by preparation finish time Tr, solder pot 13 (accommodating portion) is left to stand for at least standing time at normal temperature Th in normal temperature preservation 17, and cream solder P (material) accommodated in solder pot 13 is stirred for stirring time Tm in stirrer 18.

Note that, management computer 2 is provided with management controller 51 has the same function as that of operation procedure creator 61d provided in material preservatory 7 as an internal processor, and management computer 2 may create and transmit operation procedure information Pr to material preservatory 7 as an operation procedure.

As described above, material preservatory 7 of the embodiment is provided with preparation instruction acquirer 61a that acquires a preparation instruction (preparation instruction information Pea (Peb)), preservatory storage 62 that stores material status information Isa, entrance 14, low temperature preservation 16, normal temperature preservation 17, transporting means 19, transport controller 61b that controls the transporting means based on the preparation instruction and material status information Isa, and updater 61c that updates material status information Isa, and preserves the accommodating portion (solder pot 13) in which the material for bonding the component to the substrate (cream solder P and adhesive) is accommodated. With this, it is possible to efficiently preserve a material in consideration of the preparing operation of the material.

Note that, material preservatory 7 is provided with preservatory controller 61 having the same functions of as those of production plan acquirer 51a, production state acquirer 51b, and finish time calculator 51e provided in management computer 2, as an internal processor, and production plan information Ipb and production state information IIb stored in management storage 52 is stored in preservatory storage 62.

That is, material preservatory 7 may be provided with a preparation finish time calculator that calculates preparation finish time Tr, at which the preparation for releasing the stored accommodating portion (solder pot 13) is finished, from a production state acquirer which includes the production plan information including the substrate type of the mounting substrate obtained by mounting the component on the substrate, the production start time, or the remaining amount of the material. In this case, transport controller 61b (controller) controls transporting means 19 such that by preparation finish time Tr, the accommodating portion is left to stand for at least standing time at normal temperature Th in normal temperature preservation 17, and material (cream solder P) accommodated in the accommodating portion is stirred for stirring time Tm in stirrer 18.

Figure 5:
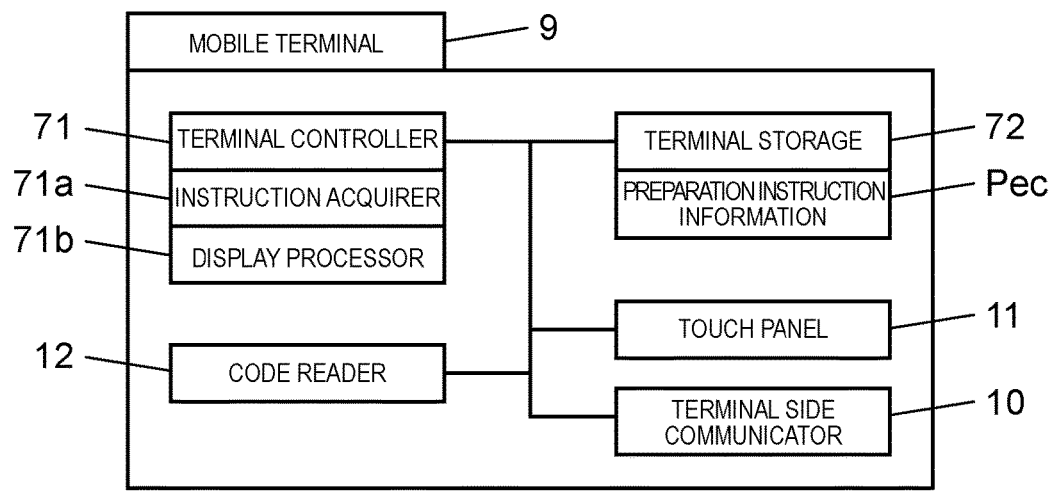
FIG. 5 is a block diagram illustrating a configuration of a control system of a mobile terminal used in the component mounting system of one embodiment of the disclosure.

Next, a configuration of a control system of mobile terminal 9 with reference to FIG. 5. Mobile terminal 9 is provided with terminal controller 71, terminal storage 72, terminal side communicator 10, touch panel 11, and code reader 12. Terminal side communicator 10 exchanges information with management computer 2 through the wireless communication. Terminal controller 71 is a computing device which has a CPU function, and includes an internal processor such as instruction acquirer 71a and display processor 71b. Terminal storage 72 is a storage device, and stores preparation instruction information Pec and the like. Instruction acquirer 71a acquires preparation instruction information Pea (first preparation instruction information Pea1 or second preparation instruction information Pea2) from management computer 2, and stores the acquired preparation instruction information in terminal storage 72 as preparation instruction information Pec (first preparation instruction information Pec1 or second preparation instruction information Pec2) (refer to FIG. 8 or FIG. 9).

Display processor 71b creates a screen display, for which the operator receives and releases the accommodating portion in and out of material preservatory 7, based on preparation instruction information Pec and various types of information of accommodating portion (solder pot 13) recognized by code reader 12, and then displays the screen display on touch panel 11. For example, in a case of receiving process, display processor 71b displays information for specifying the accommodating portion, which is transported by the operator and is inserted to entrance 14 of material preservatory 7, in an operation order. In a case of releasing process, display processor 71b displays information for specifying the accommodating portion put out by the operator from entrance 14 of material preservatory 7, and information for specifying printing device M1, and mounting devices M2 and M3 which use the accommodating portion, in an operation order.

Next, a material preparing method by management computer 2 (material management apparatus) will be described with the flow of FIG. 11. First, production plan acquirer 51a acquires production plan information Ipa (Ipb) including the material type of cream solder P (material) used in the production of the mounting substrate (ST1: production plan acquiring step). Then, material status acquirer 51c acquires material status information Isa (Isb) of the material preserved in material preservatory 7 (ST2: material status acquiring step). Next, material preparation instructor 51d creates a preparation instruction (preparation instruction information Pea) of solder pot 13 (accommodating portion) put out of material preservatory 7 based on production plan information Ipb and material status information Isb and then transmits the preparation instruction (ST3: material preparation instructing step). With this, it is possible to efficiently manage a material in consideration of a preparing operation of a material for bonding a component D to a substrate B.

Figure 12:
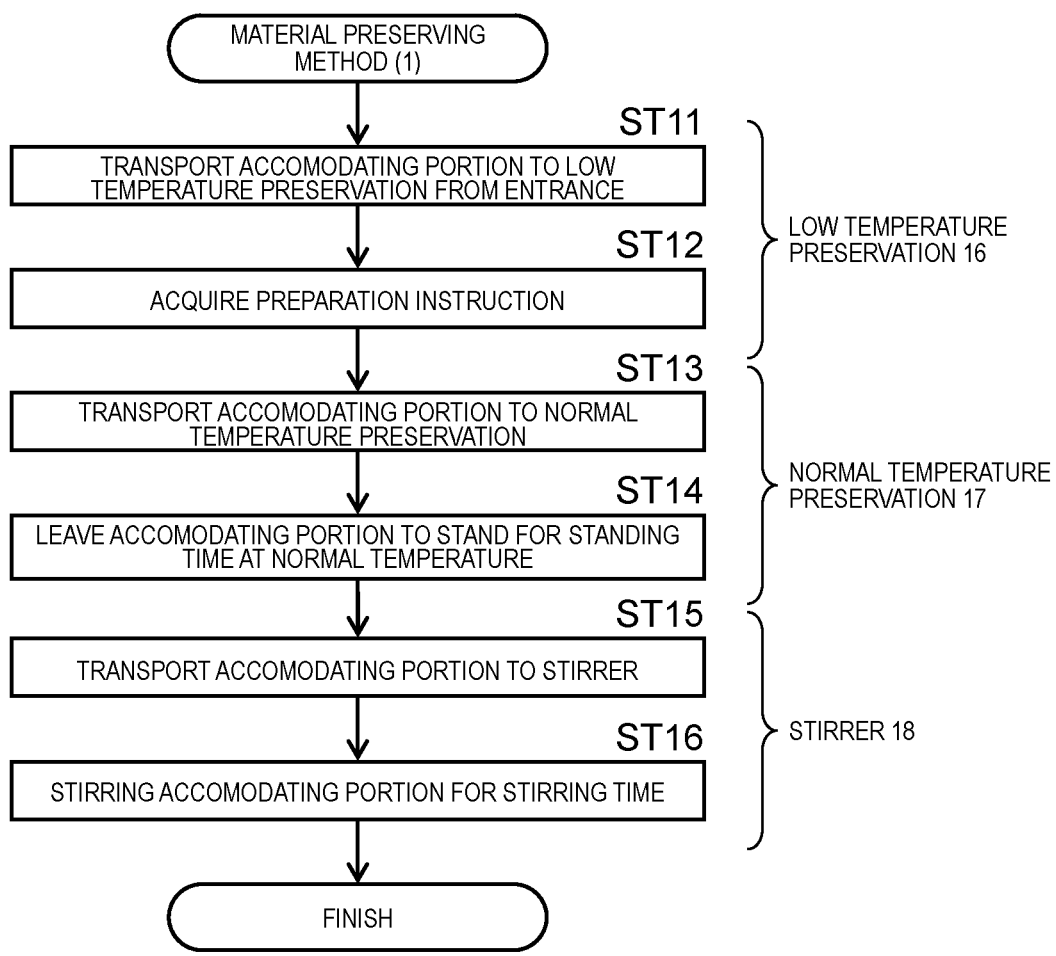
FIG. 12 is a flow chart of a first material preserving method in the material preservatory of one embodiment of the disclosure.

Next, the first material preserving method in material preservatory 7 will be described with the flow of FIG. 12. When solder pot 13 (accommodating portion) is inserted into entrance 14 of material preservatory 7, transport controller 61b controls transporting means 19 to transport solder pot 13 to low temperature preservation 16 from entrance 14 (ST11: low temperature preservation transporting step). Next, preparation instruction acquirer 61a acquires the preparation instruction (first preparation instruction information Pea1 (Peb1)) including the material type and the content of the preparing operation of the material to be prepared, from management computer 2 (refer to FIG. 8) (ST12: first preparation instruction acquiring step).

In a case where the operation content of the preparation instruction is "transport to the normal temperature preservation" (refer to FIG. 8), transport controller 61b controls transporting means 19 to transport instructed solder pot 13 (accommodating portion) to normal temperature preservation 17 from low temperature preservation 16 (ST13: first normal temperature preservation transporting step). Based on the preparation instruction, transport controller 61b causes solder pot 13 transported to normal temperature preservation 17 to be left to stand for standing time at normal temperature Th (ST14: first normal temperature standing step).

In a case where the operation content of the preparation instruction is "transport to the stirrer" (refer to FIG. 8), transport controller 61b controls transporting means 19 to transport solder pot 13 to stirrer 18 from normal temperature preservation 17 (ST15: first stirrer transporting step). Next, in a case where the operation content of the preparation instruction is "stirring execution" (refer to FIG. 8), stirrer 18 stirs cream solder P (material) accommodated in solder pot 13 transported to stirrer 18 for stirring time Tm (ST16: first stirring step). With this, the preparation for transporting and releasing solder pot 13 to entrance 14 is finished.

As described above, the first material preserving method in material preservatory 7 of the embodiment includes a low temperature preservation transporting step (ST11), a preparation instruction acquiring step (ST12), a first normal temperature transporting step (ST13), and a first normal temperature standing step (ST14). With this, it is possible to efficiently preserve a material in consideration of the preparing operation of the material for bonding the component to the substrate (cream solder P and adhesive).

Figure 13:
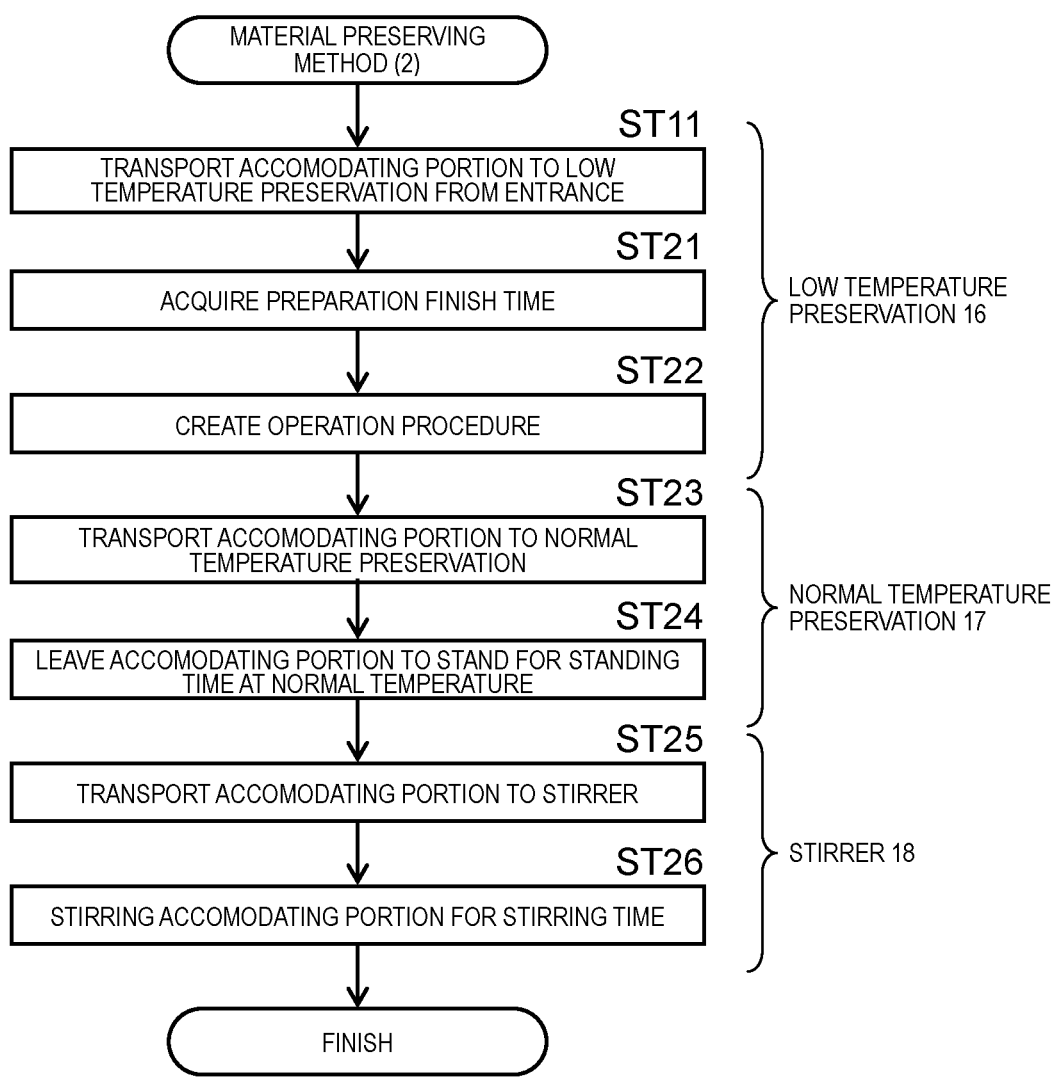
FIG. 13 is a flow chart of a second material preserving method in the material preservatory of one embodiment of the disclosure.

Next, the second material preserving method in material preservatory 7 will be described with the flow of FIG. 13. The second material preserving method is different from the first material preserving method from the point that preparation finish time Tr is included in the preparation instruction acquired from management computer 2. Hereinafter, the same reference numerals are given to the same steps, and thus redundant description will be not repeated. First, when solder pot 13 (accommodating portion) is inserted into entrance 14 of material preservatory 7, the low temperature preservation transporting step (ST11) is performed, so that solder pot 13 is transported to low temperature preservation 16.

Next, preparation instruction acquirer 61a acquires the preparation instruction (second preparation instruction information Pea2 (Peb2)) (refer to FIG. 9) including preparation finish time Tr, at which the preparation for releasing preserved solder pot 13 is finished, from management computer 2 (ST21: second preparation instruction acquiring step). Then, operation procedure creator 61d creates operation procedure information Pr (refer to FIG. 10) based on preparation finish time Tr (ST22: operation procedure creating step).

In a case where the operation content of the operation procedure is "transport to the normal temperature preservation" (refer to FIG. 10), transport controller 61b controls transporting means 19 to transport instructed solder pot 13 (accommodating portion) to normal temperature preservation 17 from low temperature preservation 16 (ST23: second normal temperature preservation transporting step). Based on the operation procedure, transport controller 61b causes solder pot 13 transported to normal temperature preservation 17 to be left to stand for standing time at normal temperature Th (ST24: second normal temperature standing step).

In a case where the operation content of the operation procedure is "transport to the stirrer" (refer to FIG. 10), transport controller 61b controls transporting means 19 to transport solder pot 13 to stirrer 18 from normal temperature preservation 17 (ST25: second stirrer transporting step). Next, in a case where the operation content of the operation procedure is "stirring execution" (refer to FIG. 10), stirrer 18 stirs cream solder P (material) accommodated in solder pot 13 transported to stirrer 18 for stirring time Tm (ST26: second stirring step). With this, the preparation for transporting and releasing solder pot 13 to entrance 14 is finished by preparation finish time Tr.

As described above, in the second material preserving method in material preservatory 7 of the embodiment, preparation finish time Tr at which the preparation for releasing the preserved accommodating portion is finished is included in the preparation instruction (the second preparation instruction information Pea2 (Peb2)) acquired in the second preparation instruction acquiring step (ST21), and the second normal temperature standing step (ST24) or the second stirring step (ST26) are finished by preparation finish time Tr. With this, it is possible to efficiently preserve a material in consideration of the preparing operation of the material for bonding the component to the substrate (cream solder P and adhesive) and preparation finish time Tr.

Figure 14:
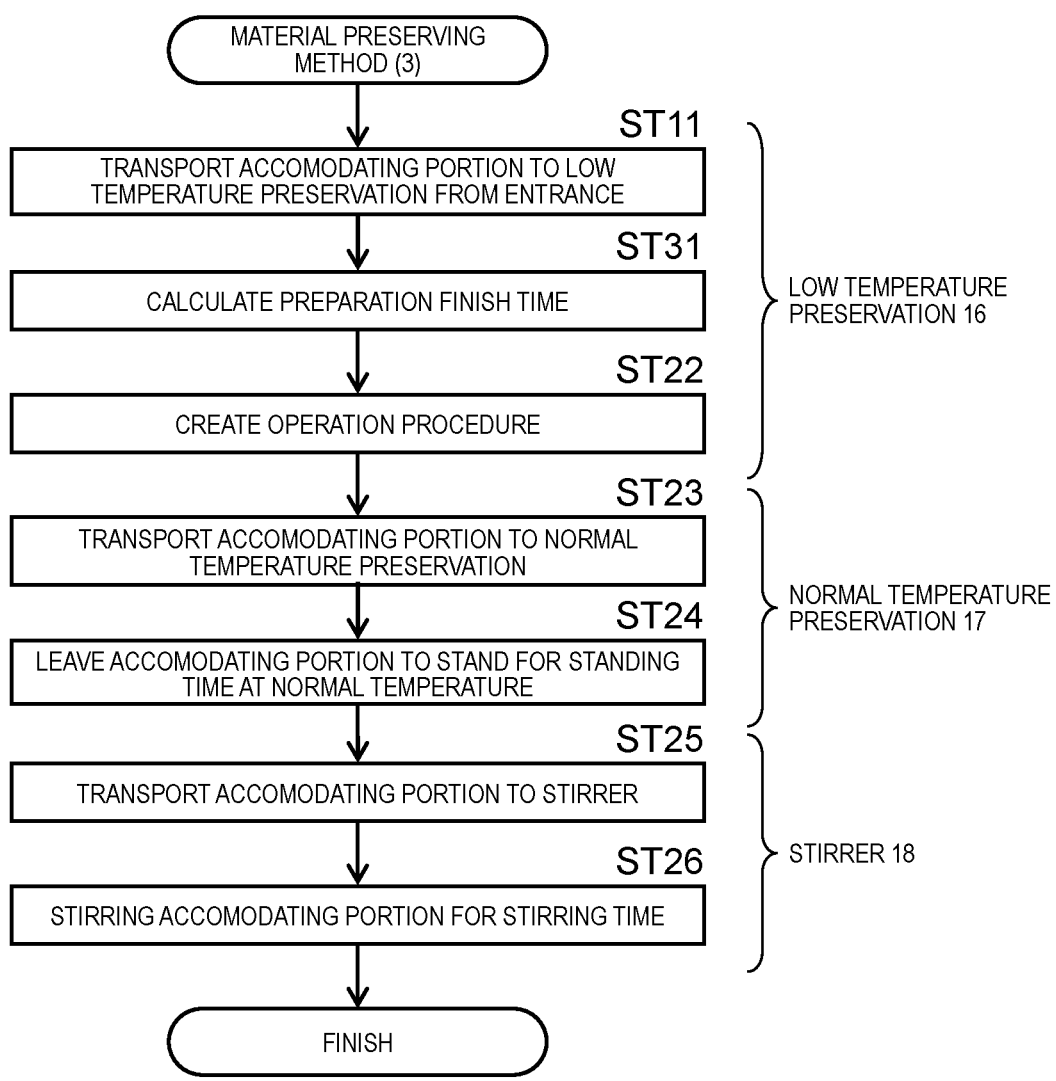
FIG. 14 is a flow chart of a third material preserving method in the material preservatory of one embodiment of the disclosure.

Next, third material preserving method in material preservatory 7 provided with finish time calculator 51e will be described with the flow of FIG. 14. The third material preserving method is different from the second material preserving method from the point that preparation finish time Tr is calculated in material preservatory 7. Hereinafter, the same reference numerals are given to the same steps, and thus detailed description will be not repeated. First, when solder pot 13 (accommodating portion) is inserted into entrance 14 of material preservatory 7, the low temperature preservation transporting step (ST11) is performed, so that solder pot 13 is transported to low temperature preservation 16.

Next, finish time calculator 51e calculates preparation finish time Tr at which the preparation for releasing preserved solder pot 13 is finished from production plan information Ipa (Ipb) including the substrate type of the mounting substrate produced by mounting the component on the substrate (ST31: preparation finish time calculating step). Then, based on preparation finish time Tr calculated in the preparation finish time calculating step (ST31), the operation procedure creating step (ST22) is performed so as to create operation procedure information Pr (FIG. 10).

Next, the second normal temperature preservation transporting step (ST23), the second normal temperature standing step (ST24), the second stirrer transporting step (ST25), and the second stirring step (ST26) are performed based on the created operation procedure. With this, the preparation for transporting and releasing solder pot 13 to entrance 14 is finished by preparation finish time Tr.

In this way, the third material preserving method in material preservatory 7 provided with finish time calculator 51e of the embodiment includes the preparation finish time calculating step (ST31) of calculating preparation finish time Tr from production plan information Ipa (Ipb), and the second normal temperature standing step (ST24) or the second stirring step (ST26) are finished by preparation finish time Tr. With this, it is possible to efficiently preserve a material in consideration of the preparing operation of the material for bonding the component to the substrate (cream solder P and adhesive) and preparation finish time Tr.

The foregoing has been described based on one embodiment of the present disclosure. It is understood by those skilled in the art that various modifications can be made to the combination of each component and each processing process in this embodiment, and that such modifications are also within the scope of the present disclosure.

In the above description, an example in which the material management apparatus (management computer 2) performs the preparation instruction of the material with respect to material preservatory 7; however the preparation instruction of the material may be performed with respect to mobile terminal 9 carried by the operator, instead of material preservatory 7. In the case where the preparation instruction of the material with respect to mobile terminal 9, the operator prepares the material in accordance with preparation instruction displayed on touch panel 11 of mobile terminal 9. Therefore, even with an operator with little operation experience can easily perform the operation, and thereby workability is improved.

Material preservatory 7 may not be provided with normal temperature preservation 17, and a material preservation shelf may be provided separately from material preservatory 7 in preservation area 4. Material preservatory 7 may not have a function of stirring the material, and a stirring device may be provided separately from material preservatory 7 in preservation area 4. Note that, in the case where normal temperature preservation 17 or the stirring function is provided from material preservatory 7, identification code C is recognized by code reader 12 of mobile terminal 9 before and after transporting the material to the material preservation shelf or the stirring device, and thereby it is possible to update the material status information.

Adhesive or the like which does not require the low temperature preservation may be preserved in normal temperature preservation 17 instead of low temperature preservation 16. With respect to the material which requires humidity management, a moisture-proof preservation may be provided in material preservatory 7 to preserve the material. The preparing operation for a plurality of materials may be performed at the same time based on production plan information Ipb, preservation state of normal temperature preservation 17, or operation status of transporting means 19. In the case where production plan information Ipb is changed by interrupt production or the like, if the material prepared before the change of production plan information Ipb can be prepared for another production after changing production plan information Ipb, the material may be used.

Material Preservatory and Material Preserving Method

The present disclosure relates to a material preservatory and a material preserving method which preserve an accommodating portion for accommodating a material for bonding a component to a substrate.

According to the present disclosure, a material preservatory which preserves an accommodating portion in which a material for bonding a component to a substrate is accommodated, the cabinet includes a preparation instruction acquirer that acquires a preparation instruction including the material type and the content of the preparing operation of the material to be prepared, a preservatory storage that stores material status information of the preserved material, an entrance through which the accommodating portion is received and released, a low temperature preservation that preserves the accommodating portion at low temperature, a normal temperature preservation that preserves the accommodating portion at temperature higher than the low temperature preservation, transporting means that transports the accommodating portion to any one of the entrance, the low temperature preservation, and the normal temperature preservation, a controller that controls the transporting means based on the preparation instruction and the material status information, and an updater that updates the material status information when the accommodating portion is transported.

According to the disclosure, it is possible to efficiently preserve a material in consideration of the preparing operation before supplying the material for bonding the component to the substrate.

The material preservatory according to the disclosure further includes a stirrer that stirs the material accommodated in the accommodating portion, in which the transporting means may transport the accommodating portion to the stirrer, and the stirrer may stir the material accommodated in the transported accommodating portion, and the updater may update the material status information when the stirrer stirs the material.

The material preservatory according to the disclosure further includes recognizing means that recognizes identification information on the accommodating portion indicated in the accommodating portion, in which the updater may update the material status information based on the recognized identification information of the accommodating portion.

The material preservatory according to the disclosure further includes a weigher that measures weight of the accommodating portion, in which the updater may update the material status information based on the measured weight of the accommodating portion.

In the material preservatory according to the disclosure, a standing time at normal temperature for which the accommodating portion is left to stand in a normal temperature preservation is further stored in the preservatory storage, and the controller may control the transporting means such that the accommodating portion is left to stand for at least the standing time at normal temperature in the normal temperature preservation.

In the material preservatory according to the disclosure, a stirring time for stirring the material in the stirrer is further stored in the preservatory storage, and the stirrer may stir the material accommodated in the accommodating portion for the stirring time.

In the material preservatory according to the disclosure, the preparation instruction includes a preparation finish time at which the preparation for releasing the preserved accommodating portion is finished, and the controller may control the transporting means such that the accommodating portion is left to stand for at least the standing time at normal temperature in the normal temperature preservation by the preparation finish time, and the stirrer stirs the material accommodated in the accommodating portion for the stirring time.

The material preservatory according to the disclosure further includes a preparation finish time calculator that calculates a preparation finish time at which the preparation for releasing the preserved accommodating portion is finished, from production plan information including the substrate type of the mounting substrate obtained by mounting the component on the substrate, the controller may control the transporting means such that the accommodating portion is left to stand for at least the standing time at normal temperature in the normal temperature preservation by the preparation finish time, and the stirrer stirs the material accommodated in the accommodating portion for the stirring time.

In the material preservatory according to the disclosure, the material status information includes a material preserving time which is elapsed time from receiving the accommodating portion, and controller may control the transporting means such that among a plurality of the accommodating portions preserved in the low temperature preservation or the normal temperature preservation, an accommodating portion having a long material preserving time is transported with priority.

According to the present disclosure, a method of preserving a material in a material preservatory which includes an entrance through which the accommodating portion, in which a material for bonding a component to a substrate is accommodated, is received and released, a low temperature preservation for preserving the accommodating portion at low temperature, and a normal temperature preservation for preserving the accommodating portion at temperature higher than the low temperature preservation, the method includes a low temperature preservation transporting step of transporting the accommodating portion to the low temperature preservation from the entrance, a preparation instruction acquiring step of acquiring a preparation instruction including the material type and the content of the preparing operation of the material to be prepared, a normal temperature preservation transporting step of transporting the instructed accommodating portion to the normal temperature preservation the low temperature preservation, and a normal temperature standing step of causing the accommodating portion to be left to stand for a standing time at normal temperature in the normal temperature preservation.

In the material preserving method according to the disclosure, the material preservatory further includes a stirrer for stirring the material accommodated in the accommodating portion, and the material preserving method may further include a stirrer transporting step of transporting the accommodating portion to the stirrer from the normal temperature preservation, and a stirring step of stirring the material to be accommodated in the accommodating portion transported to the stirrer by the stirrer for the stirring time.

In the material preserving method according to the disclosure, the preparation instruction includes a preparation finish time at which preparation for releasing the preserved accommodating portion is finished, and the normal temperature standing step or the stirring step may be finished by the preparation finish time.

According to the disclosure, the material preserving method may further include a preparation finish time calculating step of calculating a preparation finish time at which the preparation for releasing the preserved accommodating portion is finished from production plan information including the substrate type of the mounting substrate produced by mounting the component on the substrate, in which the normal temperature standing step or the stirring step may be finished by the preparation finish time.

The material management apparatus and the material preparing method have an effect of efficiently manage a material in consideration of a preparing operation of a material for bonding a component to a substrate, and are useful in a component mounting field where a component is mounted on a substrate.

What is claimed is:
1. A material management apparatus comprising:
a production plan controller configured to acquire production plan information including a type of a material for bonding a component to a substrate, the material being used for production of a mounting substrate obtained by mounting the component on the substrate;
a material status controller configured to acquire material status information on the material preserved in a material preservatory which preserves an accommodating portion in which the material is accommodated; and
a material preparation controller configured to create and transmit an instruction to prepare the accommodating portion to be put out from the material preservatory, based on the production plan information and the material status information, wherein the material preservatory has a function of preserving the accommodating portion at a low temperature and a normal temperature higher than the low temperature, wherein the material status information includes a preservation state of the accommodating portion, and wherein in a case where the preservation state of the accommodating portion to be put out is low temperature preservation, the material preparation instructor instructs for transporting the accommodating portion to be put out to normal temperature preservation from the low temperature preservation, wherein the material preservatory further has a function of stirring the material accommodated in the accommodating portion, wherein the material status information includes an elapsed standing time at normal temperature from a time of transporting the accommodating portion to the normal temperature preservation, and wherein in a case where the elapsed standing time at the normal temperature has elapsed a predetermined standing time at the normal temperature, the material preparation instructor instructs for stirring the material accommodated in the accommodating portion transported to normal temperature preservation.

2. The material management apparatus of claim 1, further comprising:
a production state controller configured to acquire production state information including at least one of a production start time of the mounting substrate and a remaining amount of the material used in production equipment for producing the mounting substrate; and
a preparation finish time calculator that calculates a preparation finish time, at which preparation for putting out the accommodating portion from the material preservatory is finished, based on the production state information,
wherein the material preparation instructor instructs for finishing the preparation for putting out the accommodating portion before the preparation finish time.

3. The material management apparatus of claim 1,
wherein the production plan information includes a number of the mounting substrates to be produced,
wherein the apparatus further comprises a preparation finish time calculator that calculates a preparation finish time, at which preparation for putting out the accommodating portion from the material preservatory is finished, based on the number of the mounting substrates to be produced and a consumption amount of the materials consumed per mounting substrate to be produced, and
wherein the material preparation instructor instructs for finishing the preparation for putting out the accommodating portion before the preparation finish time.

4. The material management apparatus of claim 1,
wherein the material status information includes a weight of the accommodating portion, and
wherein the material preparation instructor instructs for putting out a lighter accommodating portion, among a plurality of the accommodating portions preserved in the material preservatory.

5. A material management apparatus comprising:
a production plan controller configured to acquire production plan information including a type of a material for bonding a component to a substrate, the material being used for production of a mounting substrate obtained by mounting the component on the substrate;
a material status controller configured to acquire material status information on the material preserved in a material preservatory which preserves an accommodating portion in which the material is accommodated; and
a material preparation instructor configured to create and transmit an instruction to prepare the accommodating portion to be put out from the material preservatory, based on the production plan information and the material status information,
wherein the material status information includes a material preserving time which is an elapsed time from a time of receiving the accommodating portion in the material preservatory, and
wherein the material preparation instructor instructs for preferentially putting out an accommodating portion having a longer material preserving time, among a plurality of the accommodating portions preserved in the material preservatory.

6. A material preparing method comprising:
acquiring production plan information including a type of a material for bonding a component to a substrate, the material being used for production of a mounting substrate obtained by mounting the component on the substrate;
acquiring material status information on the material preserved in the material preservatory which preserves an accommodating portion in which the material is accommodated; and
creating and transmitting a preparation instruction of the accommodating portion put out from the material preservatory, based on the production plan information and the material status information,
wherein the material preservatory has a function of preserving the accommodating portion at a low temperature and a normal temperature higher than the low temperature,
wherein the material status information includes a preservation state of the accommodating portion, and
wherein in a case where the preservation state of the accommodating portion to be put out is low temperature preservation, the material preparation instructor instructs for transporting the accommodating portion to be put out to normal temperature preservation from the low temperature preservation,
wherein the material preservatory further has a function of stirring the material accommodated in the accommodating portion,
wherein the material status information includes an elapsed standing time at normal temperature from a time of transporting the accommodating portion to the normal temperature preservation, and
wherein in a case where the elapsed standing time at the normal temperature has elapsed a predetermined standing time at the normal temperature, the material preparation instructor instructs for stirring the material accommodated in the accommodating portion transported to normal temperature preservation.

7. A method for operating a material management apparatus, the method comprising:
acquiring production plan information including a type of a material for bonding a component to a substrate, the material being used for production of a mounting substrate obtained by mounting the component on the substrate;

acquiring material status information on the material preserved in a material preservatory which preserves an accommodating portion in which the material is accommodated; and creating and transmitting an instruction to prepare the accommodating portion to be put out from the material preservatory, based on the production plan information and the material status information, wherein the material preservatory has a function of preserving the accommodating portion at a low temperature and a normal temperature higher than the low temperature, wherein the material status information includes a preservation state of the accommodating portion, and wherein in a case where the preservation state of the accommodating portion to be put out is low temperature preservation, the material preparation instructor instructs for transporting the accommodating portion to be put out to normal temperature preservation from the low temperature preservation, wherein the material preservatory further has a function of stirring the material accommodated in the accommodating portion, wherein the material status information includes an elapsed standing time at normal temperature from a time of transporting the accommodating portion to the normal temperature preservation, and wherein in a case where the elapsed standing time at the normal temperature has elapsed a predetermined standing time at the normal temperature, the material preparation instructor instructs for stirring the material accommodated in the accommodating portion transported to normal temperature preservation.

8. A material management apparatus comprising:

a material preservatory including a low temperature storage for storing a solder pot at a lower temperature and a normal temperature storage for storing the solder pot at a normal temperature, the lower temperature being lower than the normal temperature;

a stirrer configured to stir the solder pot;

a transportation device configured to transport the solder pot among the low temperature storage, the high temperature storage and the stirrer;

a processor configured to cause the transportation device to transport the solder pot from the low temperature storage to the normal storage temperature and then from the normal storage temperature to the stirrer.

9. The material management apparatus according to claim 8, wherein the processor is further configured to:
obtain material status information including a standing time during which the solder pot is to stay at the normal temperature storage; and
cause the transportation device to transport the solder pot from the normal storage temperature to the stirrer after the standing time elapses.

10. A method for operating a material management apparatus, the method comprising:

receiving a solder pot from an entrance into a material preservatory including a low temperature storage for storing a solder pot at a lower temperature and a normal temperature storage for storing the solder pot at a normal temperature, the lower temperature being lower than the normal temperature;

storing the solder pot at the low temperature storage;

in response to receiving a preparation instruction, transporting the solder pot from the low temperature storage to the low temperature storage for a certain time; and after the certain time, transporting the solder pot from the normal temperature storage to a stirrer to stir the solder pot.

11. The method for operating the material management apparatus according to claim 10, wherein the material status information including a standing time during which the solder pot is to stay at the normal temperature storage.

* * * * *